(12) United States Patent
Balcioglu (10) Patent No.: US 11,570,400 B2
(45) Date of Patent: Jan. 31, 2023

(54) SYSTEMS AND METHODS FOR ASYMMETRIC IMAGE SPLITTER CLOCK GENERATION

(71) Applicant: Maxim Integrated Products, Inc., San Jose, CA (US)

(72) Inventor: Yalcin Balcioglu, Istanbul (TR)

(73) Assignee: Analog Devices, Inc., Wilmington, MA (US)

(*) Notice: Subject to any disclaimer, the term of this patent is extended or adjusted under 35 U.S.C. 154(b) by 649 days.

(21) Appl. No.: 16/381,267

(22) Filed: Apr. 11, 2019

(65) Prior Publication Data

US 2019/0387197 A1 Dec. 19, 2019

Related U.S. Application Data

(60) Provisional application No. 62/684,326, filed on Jun. 13, 2018.

(51) Int. Cl.
*H04N 7/12* (2006.01)
*G06F 1/04* (2006.01)
(Continued)

(52) U.S. Cl.
CPC ............ *H04N 7/12* (2013.01); *G06F 1/04* (2013.01); *H03M 3/428* (2013.01); *H04L 7/033* (2013.01);
(Continued)

(58) Field of Classification Search
CPC .......... H04N 7/12; H04N 7/104; H04N 7/108; H04N 21/234; H04N 21/2365;
(Continued)

(56) References Cited

U.S. PATENT DOCUMENTS 7,295,578 B1 * 11/2007 Lyle ................. G06F 3/14
348/473
8,537,956 B1 9/2013 Pham et al.
(Continued)

FOREIGN PATENT DOCUMENTS

CN 101640707 A 2/2010
CN 102918836 A 5/2011
(Continued)

OTHER PUBLICATIONS

Chinese office action dated May 7, 2022 in related Chinese patent application No. 201910514395 X, (27 pgs).
(Continued)

*Primary Examiner* — Jefferey F Harold
*Assistant Examiner* — Alexander Boyd
(74) *Attorney, Agent, or Firm* — North Weber & Baugh LLP; Michael North (57) ABSTRACT

Described herein are systems and methods that provide for asymmetric image splitter image stream applications. In one embodiment, a system supporting image multi-streaming comprises an asymmetric image splitter engine that splits super-frame image streams into two or more image streams and a fractional clock divider circuit. The fractional clock divider may comprise a digital feedback control loop and a one-bit sigma delta modulator. The fractional clock divider circuit may provide compatible display clock frequencies for each of the two or more image streams. When a multi-image stream comprises the two image streams, the asymmetric image splitter engine adjusts a vertical asymmetry of a first image stream with a shortest height to same height as a second image stream by adding vertical padding to the first image stream. The super-frame image streams may comprise image streams from video, LIDAR, radar, or other sensors.

18 Claims, 8 Drawing Sheets

(51) Int. Cl.
| | |
|---|---|
| *H03M 3/00* | (2006.01) |
| *H04L 7/033* | (2006.01) |
| *H04N 21/234* | (2011.01) |
| *H04N 21/2365* | (2011.01) |
| *H04N 21/414* | (2011.01) |
| *H04N 7/10* | (2006.01) |
| *H03L 7/193* | (2006.01) |
| *H03L 7/197* | (2006.01) |

(52) U.S. Cl.
CPC ............. *H04N 7/104* (2013.01); *H04N 7/108* (2013.01); *H04N 21/234* (2013.01); *H04N 21/2365* (2013.01); *H04N 21/41422* (2013.01); *G09G 2310/08* (2013.01); *H03L 7/193* (2013.01); *H03L 7/1974* (2013.01); *H03L 7/1976* (2013.01); *H04L 7/0331* (2013.01); *H04N 2201/04768* (2013.01)

(58) Field of Classification Search
CPC .... H04N 21/41422; H04N 2201/04768; G06F 1/04; H03M 3/428; H04L 7/033; H04L 7/0331; G09G 2310/08; H03L 7/193; H03L 7/1974; H03L 7/1976
See application file for complete search history.

(56) References Cited

U.S. PATENT DOCUMENTS

| | | | |
|---|---|---|---|
| 8,913,196 | B2 | 12/2014 | Hamamura |
| 2007/0001722 | A1* | 1/2007 | Young ................... H04J 3/076 327/156 |
| 2015/0303930 | A1* | 10/2015 | Chen ........................ H03L 7/24 327/156 |
| 2016/0211861 | A1* | 7/2016 | Op 't Eynde ......... H03M 1/109 |
| 2017/0163994 | A1* | 6/2017 | Sanchez De La Fuente ............... H04N 21/4312 |
| 2019/0013929 | A1 | 1/2019 | Hailu et al. |
| 2019/0074842 | A1* | 3/2019 | Sun ....................... H03L 7/1974 |
| 2019/0313053 | A1* | 10/2019 | Chane .............. H04N 21/41422 |

FOREIGN PATENT DOCUMENTS

| | | |
|---|---|---|
| CN | 107554452 A | 9/2017 |
| WO | 2017160947 A1 | 9/2017 |

OTHER PUBLICATIONS

Chinese office action response filed Aug. 4, 2022 in related Chinese patent application No. 201910514395.X, (4 pgs).

* cited by examiner

Asymmetric dual-view splitter with super-frame structure comprising video 204 and video 206. Embodiment 200 is generated in SoC 121

_SYSTEMS AND METHODS FOR ASYMMETRIC IMAGE SPLITTER CLOCK GENERATION_

CROSS-REFERENCE TO RELATED APPLICATIONS

This patent application is related to and claims priority benefit under 35 U.S.C. § 119(e) and commonly-owned U.S. Provisional Patent Application No. 62/684,326, entitled "SYSTEMS AND METHODS FOR ASYMMETRIC DUAL-VIEW CLOCK GENERATION," naming as inventor Yalcin Balcioglu, and filed Jun. 13, 2018, which patent document is incorporated by reference herein in its entirety and for all purposes.

A. TECHNICAL FIELD

The present disclosure relates generally to systems and methods for serializing/deserializer (SerDes) communications. More particularly, the present disclosure related to systems and methods for asymmetric image splitter applications.

B. BACKGROUND

Gigabit Multimedia Serial Link (GMSL) serializer and deserializers (SerDes) may support the high bandwidth, complex interconnect, and data integrity requirements required for a variety of applications. For example, but without limitations, the applications may include low-power requirements for cameras and widely varying bandwidth of sensor data aggregations. Using shielded twisted pair (STP) or coax cables of up to 15 meters, GMSL serializers and deserializers may meet stringent electromagnetic compatibility (EMC) requirements of the automotive and other industries. In some embodiments, the applications may include future automotive infotainment and advanced driver assistance systems (ADAS).

Spread-spectrum capability may be built into each serializer and deserializer IC to improve the electromagnetic interference (EMI) performance of the link, without the need for an external spread-spectrum clock. Interoperation of serializers and deserializers within the family allows the use of different interfaces at each end of the link. In addition to driving high-resolution central/rear-seat displays and instrument clusters, GMSL SerDes systems can also be used in megapixel camera systems.

In some embodiments, GMSL SerDes systems may be implemented with asymmetric image splitters (e.g., an asymmetric side-by-side dual-view splitter engine) to receive a single super video stream containing multiple display images. In order to generate the video clocks for individual displays within the video multi-streaming system, phase lock loop (PLL) oscillators may be utilized in the asymmetric image splitter blocks. The PLLs may require additional cost, size and power consumption.

Accordingly, what is needed are systems and methods that may implement an asymmetric image splitter clock generation block without PLLs.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF EMBODIMENTS

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Components, or modules, shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated.

Furthermore, it shall be noted that: (1) certain steps may optionally be performed; (2) steps may not be limited to the specific order set forth herein; (3) certain steps may be performed in different orders; and (4) certain steps may be done concurrently.

Figure 1A:
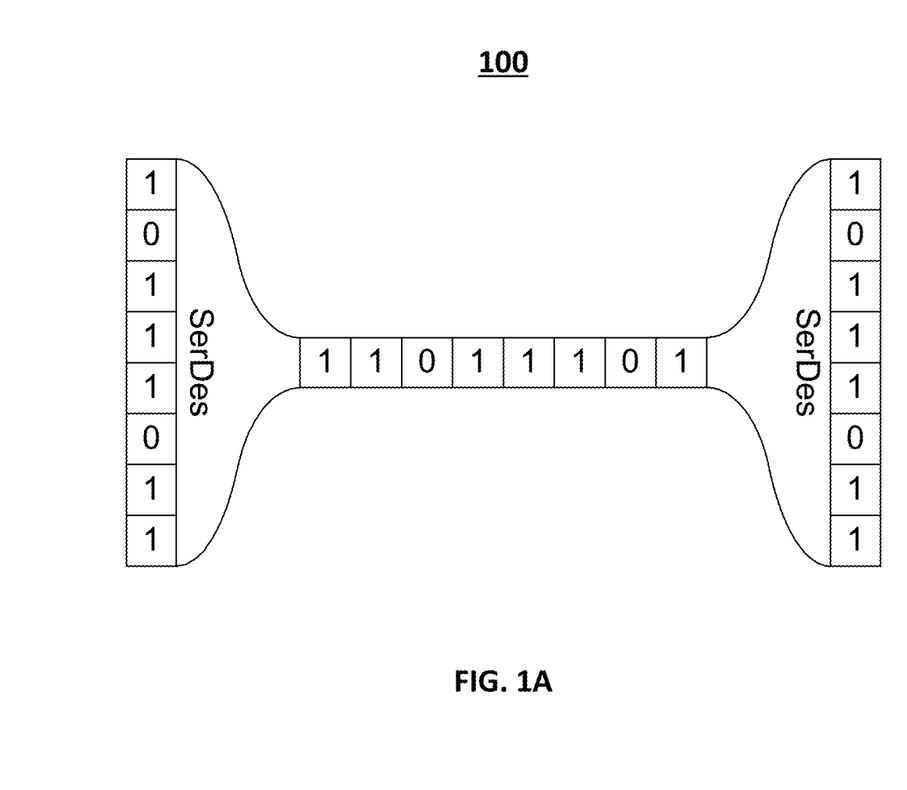
FIG. 1A illustrates the functionality of a serializer/deserializer (SerDes) according to various embodiments of the present disclosure.

FIG. 1A illustrates the functionality of a serializer/deserializer (SerDes) 100 according to various embodiments of the present disclosure. A serializer/deserializer (SerDes) 100 may utilize a multigigabit, point-to-point connection technology. Effectively, SerDes 100 is a pair of functional blocks that may be used in high speed communications to compensate for limited inputs and outputs. These blocks may convert data between serial data and parallel interfaces in each direction. In some embodiments, SerDes 100 may provide data transmission over a single/differential line in order to minimize the number of I/O pins and interconnects. Parallel clock SerDes may be used to serialize a parallel bus input along with data address and control signals. The serialized stream may be sent along with a reference clock. In some embodiments, the clock may be provided via a phase lock loop (PLL) oscillator. The serialized stream may be referred to as a super-frame image stream.

In some embodiments for video applications, to achieve a resolution of 800×600 pixels, a video clock of 70 MHz may be required. In another embodiment, to achieve full HD with a resolution of 1920×1080 pixels, a video clock frequency of 140 MHz may be required.

In some embodiments, the multigigabit, point-to-point connection technology is Gigabit Multimedia Serial Link (GMSL) SerDes technology. GMSL technology may simultaneously transports HD video, audio, control information, aggregated sensor data, and Gigabit Ethernet over 15 meters of a single coaxial cable or 10 meters to 15 meters of shielded-twisted pair cabling, all while meeting automotive electromagnetic compatibility (EMC) specifications. The use of coaxial and shielded-twisted pair cables can mitigate what would otherwise be a complex interconnect backbone, supporting video multi-streaming at lower system cost. Compared to Ethernet technology, GMSL technology can transport multi-megapixel images without compression. As such, GMSL can support the machine vision technology that is becoming essential for safety features such as object and pedestrian detection. Other embodiments utilizing data compression may result in artifacts and lost information that may limit the ability to support machine vision.

Each GMSL SerDes IC may feature a built-in spread-spectrum capability, which reduces electromagnetic interference (EMI) of the link. The power-over-coaxial architecture of the ICs may eliminate the need for additional power or ground wires, addressing vehicle weight challenges. With an integrated bidirectional control channel, a single microcontroller can program the serializer, deserializer, and all of the connected peripherals. In one or more embodiments, this architecture eliminates a remote-side microcontroller and its support components, simplifying the design and reducing cost, size, and power consumption. Also lowering system costs as well as reducing design time is the ability to daisy-chain multiple camera modules over GMSL. Data integrity is enhanced from the technology's built-in diagnostic capabilities.

Figure 1B:
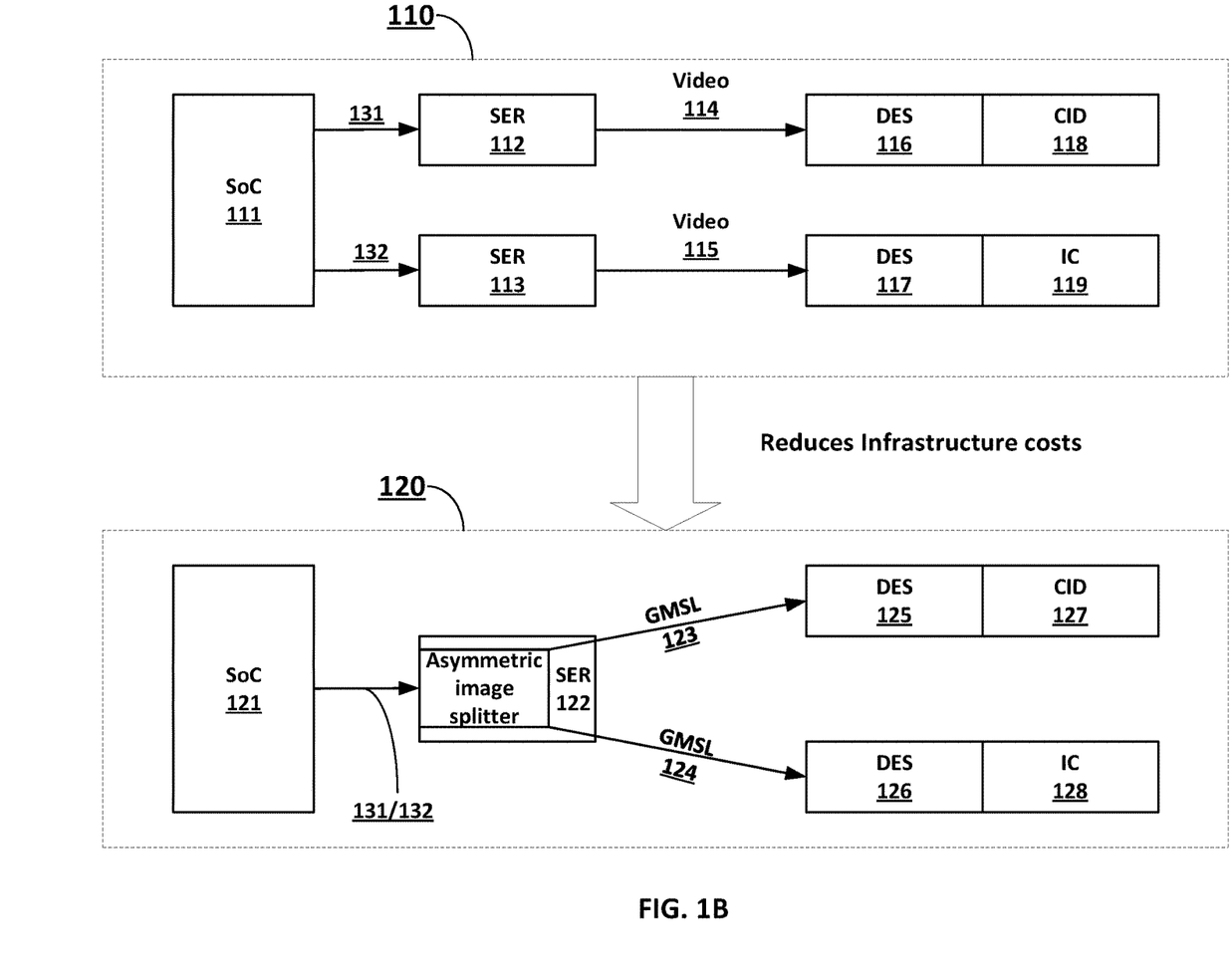
FIG. 1B depicts two configurations for video multi-streaming according to various embodiments of the present disclosure.

FIG. 1B depicts two configurations for video multi-streaming according to various embodiments of the present disclosure. As shown in FIG. 1B, GMSL technology allows video aggregation and video splitting. Video system 110 comprises SoC 111, serializers (SER 112, SER 113), deserializers (DES 116, DES 117), CID 118 and an IC 119. (CID=central instrument display; IC=instrument cluster) SoC is a system-on-a-chip. As illustrated, SER 112 and SER 113 separately receive a video signal 131 and video signal 132, respectively, from SoC 111. SER 112 and SER 113 process their respective videos signals, and generate video 114 and video 115, respectively. Video 114 and video 115 are respectively coupled to DES 116 and DES 117, and generate CID 118 and an IC 119, respectively. For video system 110, the video signals from SoC 111 may be processed in parallel, requiring separate serializers and additional I/O interfaces. In one or more embodiments, the super-frame image streams comprise image streams from video, LIDAR (Light Detection and Ranging), radar, or other sensors. The super-frame image streams comprises image streams supporting Advanced Driver-Assistance Systems (ADAS) or automotive infotainment applications Asymmetric Image Splitter In some other embodiments, video system 120 utilizes GMSL technology that allows video aggregation and video splitting. As illustrated, video system 120 comprises SoC 121, serializer, SER 122, deserializers, DES 125 and DES 126, CID 127 and an IC 128. Per FIG. 1B, SER 122 receives a multi-video signal 131/132 from SoC 121. Multi-video signal 131/132 comprises the content of video signal 131 and video signal 132. In other words, the multi-video signal 131/132 comprises two video signals and may be referred to as a super-frame image stream. SER 122, comprising an asymmetric image splitter, and generates GMSL 123 and GSML 124. GMSL 123 and GSML 124 are coupled to DES 125 and DES 126, and generate CID 127 and an IC 128, respectively. An example of the asymmetric image splitter at the input of SER 122 may include but is not limited to an asymmetric side-by-side dual-view splitter. In some embodiments, multiple images in the input super-frame may be in side-by-side formation. As illustrated, with GMSL technology, infrastructure costs may be reduced.

Many of asymmetric image splitter blocks operate using PLLs to generate the video clocks for individual displays. Utilization of PLLs to generate video clocks for individual displays may elevate the power and area consumption considerably.

The number of displays in vehicles is continuously increasing. Traditionally a system designer would need to associate an individual SOC video output port to each display. As the number of displays increase, this may mean that more SOCs are needed or the SOCs with more video output ports must be selected thereby increasing cost. If a SOC video port can be used to drive multiple displays with a single virtual channel, cheaper SOCs with less output ports can be used in the system and cost can be reduced.

In some embodiments, asymmetric image splitter engines operate using an algorithm to extract the individual video images from a multi-image input. This procedure may create a requirement where the transmitter and the receiver must be designed in agreement and in advance by multiple vendors.

Figure 2A:
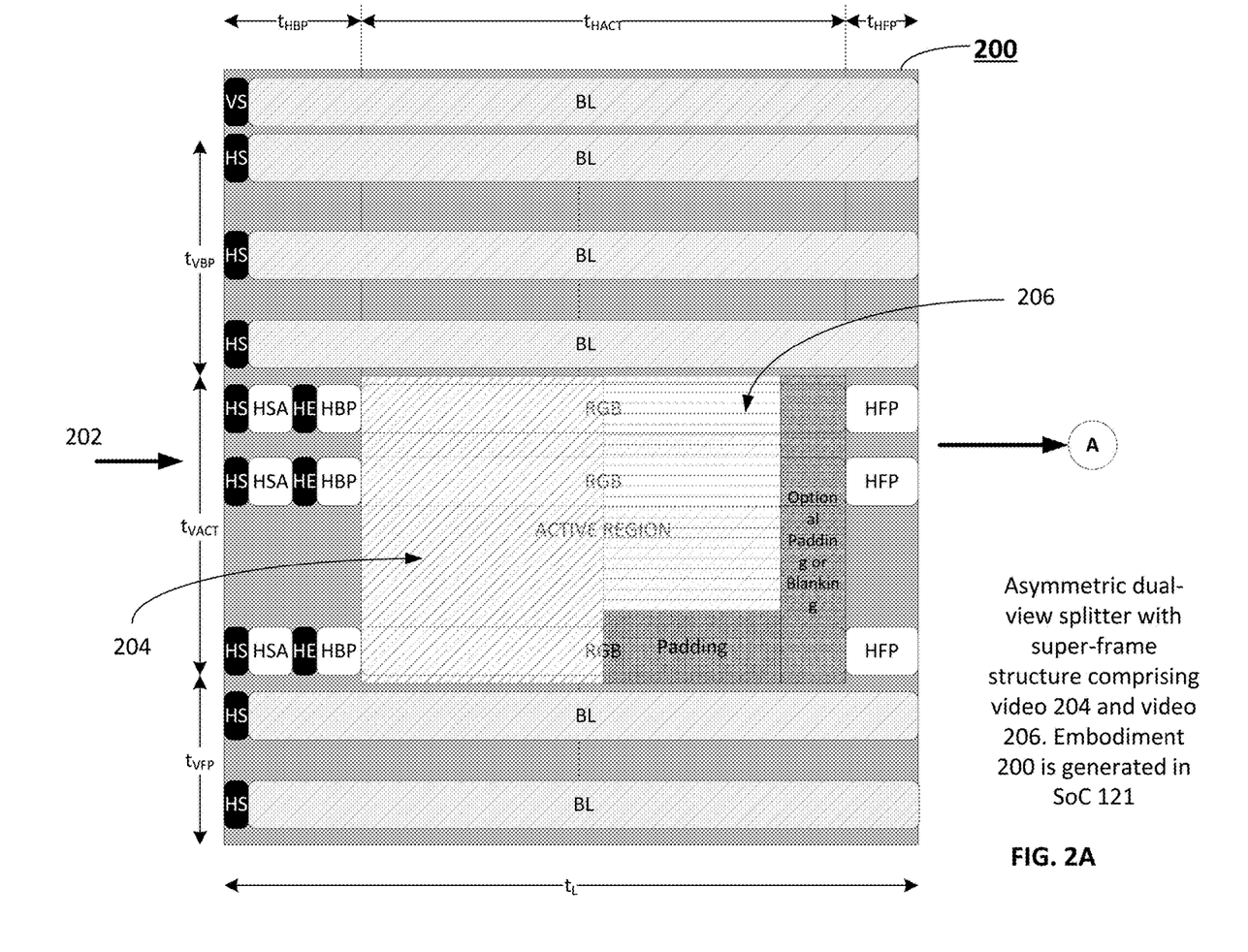
FIG. 2A, FIG. 2B and FIG. 2C depict multi-streaming video and video splitting according to various embodiments of the present disclosure.
Figure 2B:
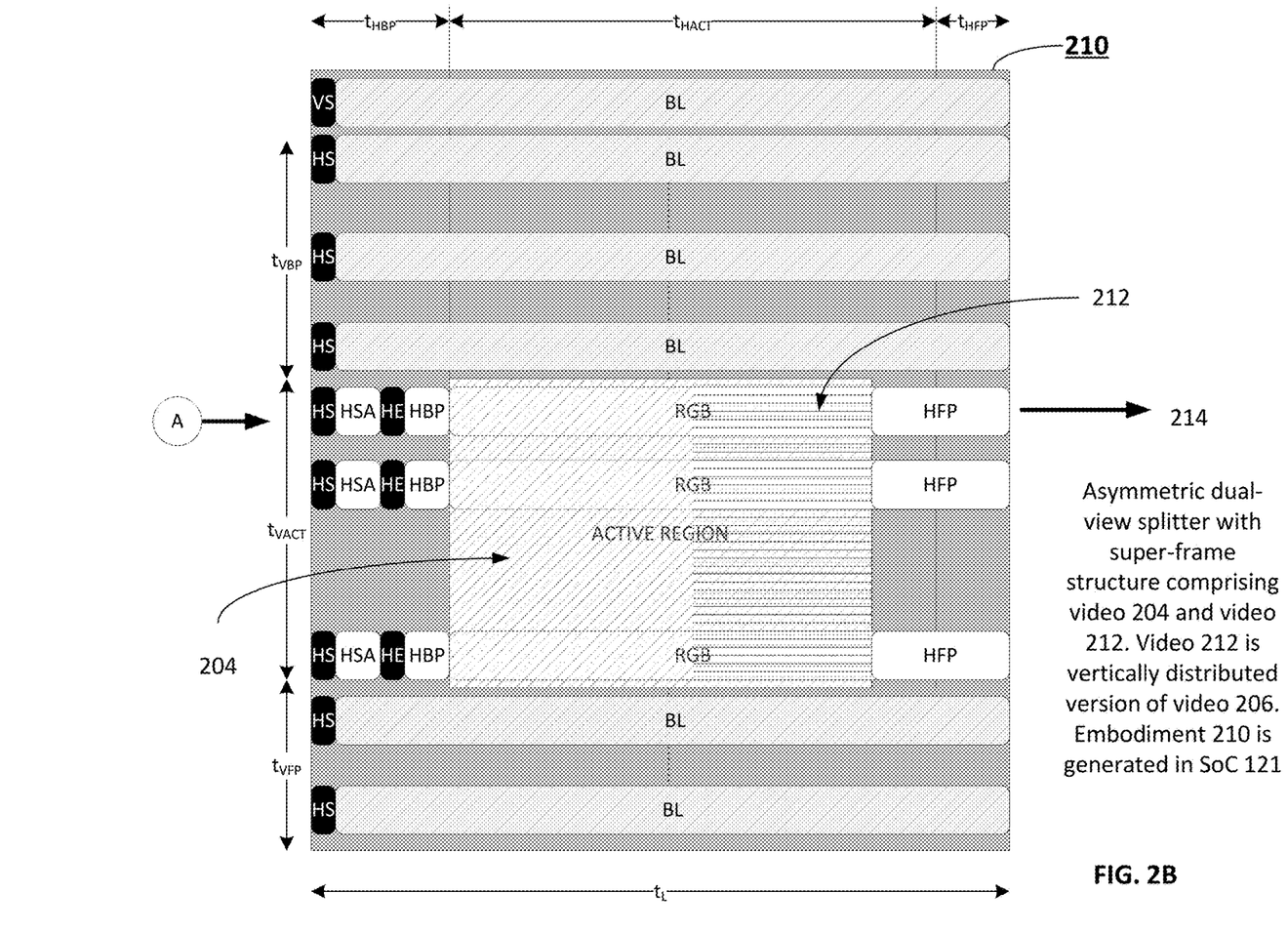
Figure 2C:
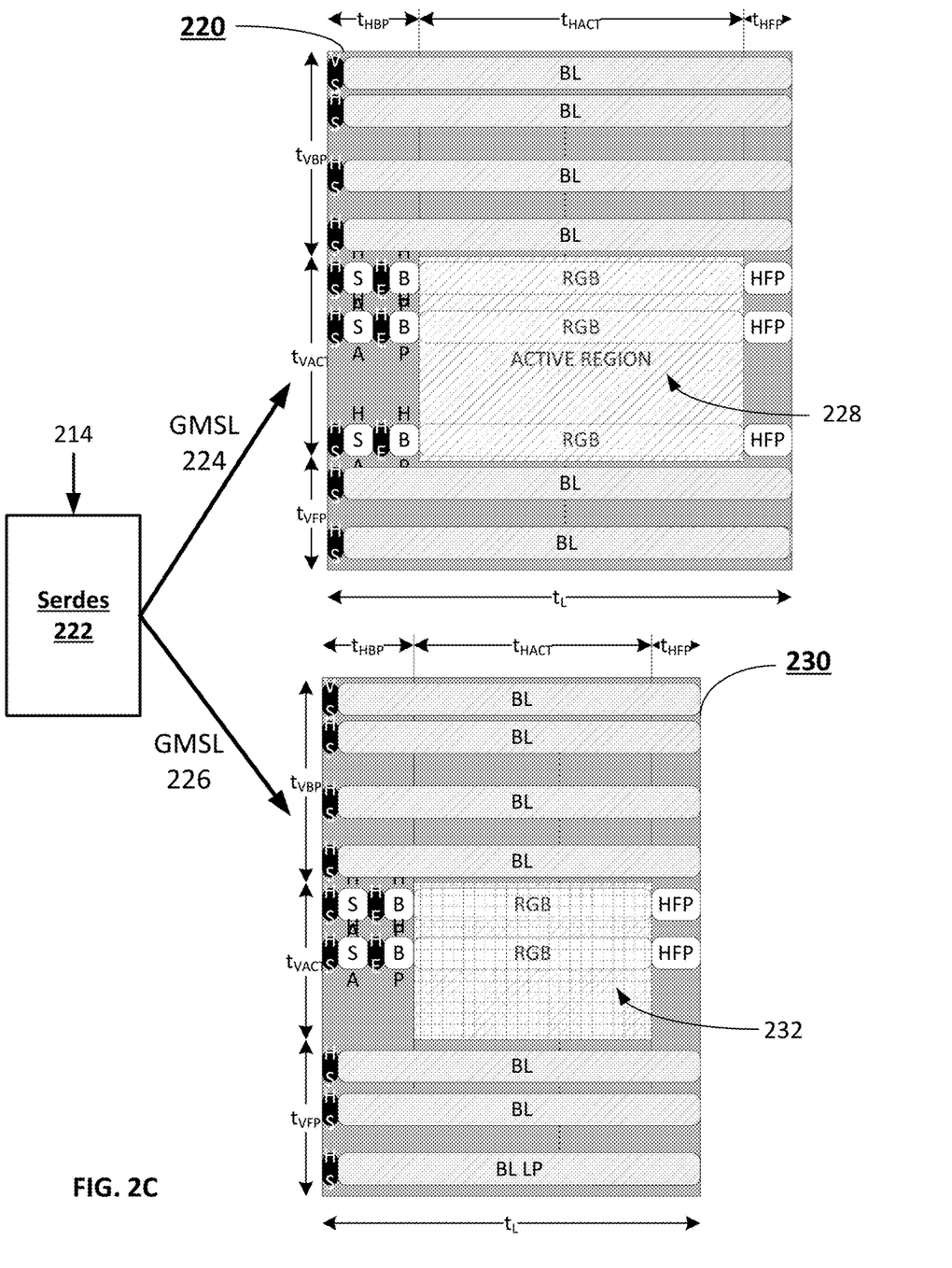

FIG. 2A, FIG. 2B and FIG. 2C depict multi-streaming video and video splitting according to various embodiments of the present disclosure. The following terms are included in these figures: HS=horizontal sync; VS=vertical sync; Tvbp=vertical backporch time; Tvfp=vertical frontporch time; Tvact=vertical active time; Thbp=horizantal backporch time; Thfp=horizontal frontporch time; Thact=horizontal active time; HSA=horizontal sync active time; BL=blanking line. FIG. 2A, FIG. 2B and FIG. 2C illustrates that asymmetric image splitter allows multiple displays with different resolutions to be driven from the same SOC video output port. In some embodiments, FIG. 2A and FIG. 2B may be implemented in SoC 121, and FIG. 2C may be implemented in SER 122 and displayed on DES 125 and DES 126.

Per video frame 200 of FIG. 2A, and input signal 202 comprising the active region of video image 204 (angle line pattern) and video image 206 (parallel line pattern), which are combined side by side and top aligned to form a super-frame. As illustrated, video image 204 has a higher imager than video image 206. Located below and to the right of video image 206 is an unused area designated as Padding and Optional Padding or Blanking. The vertical asymmetry of the shorter image, video image 206, increases the memory requirement in the splitter device. To mitigate this issue, the shorter image (i.e., video image 206) is vertically distributed to match the height of the higher video stream (i.e., video image 204) using dummy video lines. Video frame 210 of FIG. 2B illustrates that video image 206 has been vertically distributed.

The line stuffed super-frame is transmitted from the SOC video port with a video clock frequency faster than the individual displays associated with video image 204 and video image 212 displays. An output of the system-on-a chip (i.e., SoC 121) may be illustrated by output 214 of video frame 210.

Per FIG. 2C, output 214 may be coupled to SER 222. When the SER 222 receives the super-frame from output 214, it splits video frame 210 into two displays with compatible display timing parameters together with associated display video clock frequencies that are different than the super-frame. In some embodiments, the clock frequency of the super-frame is 200 MHz and the clock frequency of video image 228 (angle line pattern) may be 148 MHz, and the clock frequency of video image 232 (square line pattern) may be 67 MHz. The term "clock frequency of the video image" may also be referred to as a "display clock".

A display, e.g., DES 125, receives a signal, GMSL 224 from SER 222, and generates video frame 220. Video frame 220 may comprise video image 228, which was generated from video image 204 of FIG. 2B. Another display, e.g., DES 126, receives a signal, GMSL 226 from SER 222, and generates video frame 230. Video frame 230 may comprise video image 232, which was generated from video image 212 of FIG. 2B. Hence, the video in the super-frame is split into individual video streams. After the split, the individual video streams can be transferred to a remote location either using the same serial link or separate serial links.

Generation of Individual Display Clocks

In some embodiments, display panels and timing controllers have varying levels of flexibility when it comes to how the data input can be streamed in to the display panels. While more expensive and sophisticated displays can accept burst and sporadic video input streams, less expensive displays and timing controllers may have inflexible requirements for the pixel clock frequency (PCLK) and display's blanking timing parameters. Therefore, the less expensive panels may require a perfectly smooth video stream input. To enable customers to use less expensive system components, it can be required to re-time the video image from the super-frame with the native PCLK frequency and blanking time parameters of the individual displays. Hence, it may be required to generate any fraction of the super-frame PCLK frequency to drive the individual displays.

In some embodiments, the number of pixels in each frame including blanking time may determine the pixel clock frequency ratios between all three images including video image 228 (angle line pattern) and video image 232 (square pattern) and the super-frame image. In basic video interfaces such as DSI, parallel or LVDS between SOC and the SerDes receiver, the number of pixels in each super-frame is assumed to be the same frame to frame. Additionally, it can be assumed that the display video interface clock frequency has a ratio of integers relationship to the super-frame video pixel clock frequency. The integers ratio is equal to M/N. For example, in DSI interface video interface clock frequency is different than the video pixel clock frequency which in some cases might be M/N=67 MHz/200 MHz. When above assumptions are true, the input and output data flow ratio in the system is deterministic and the system can generate the split displays' pixel clock signals in an open loop fashion without feedback using ratio of two large integers.

Figure 3:
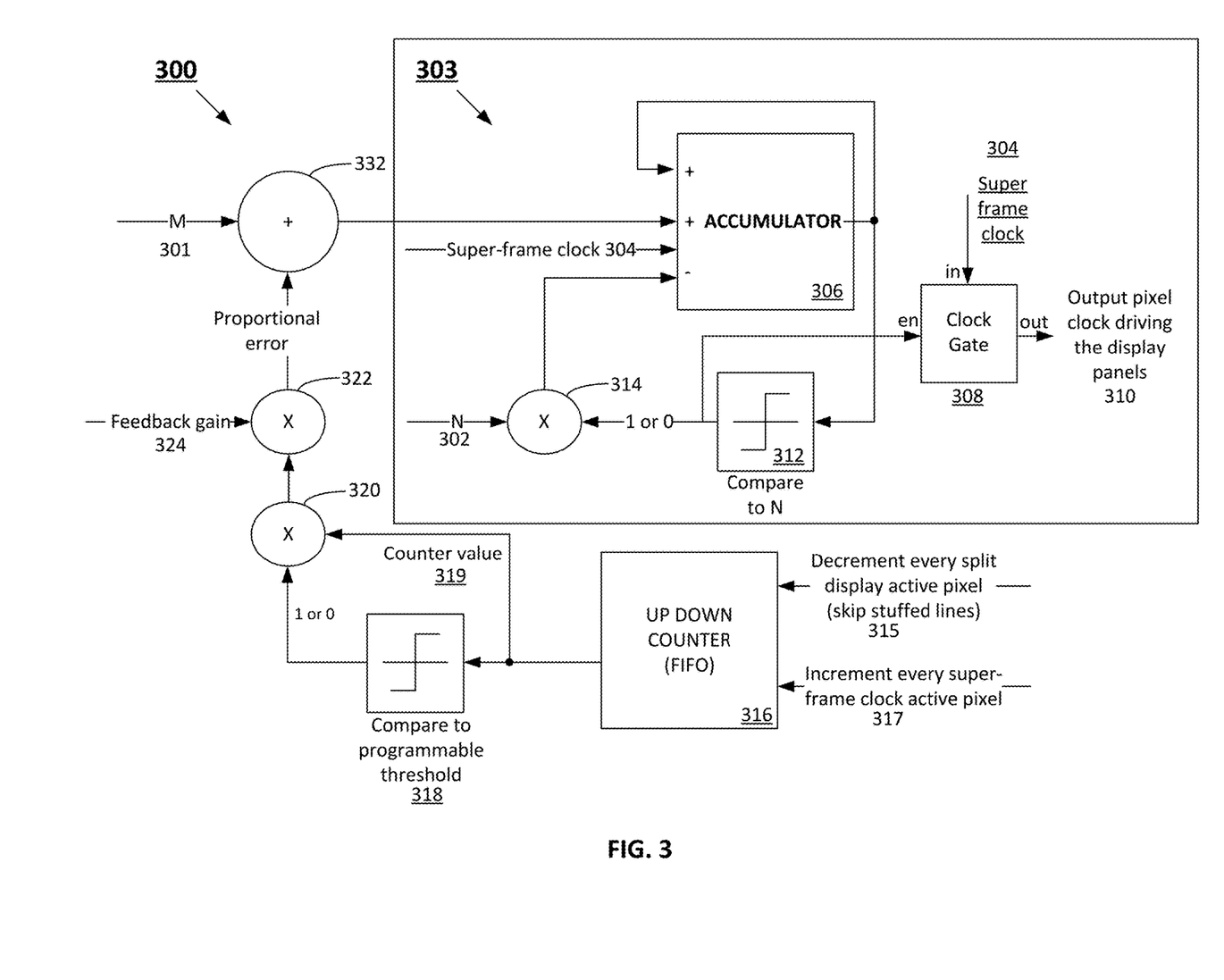
FIG. 3 depicts a fractional clock divider according to various embodiments of the present disclosure.

On the other hand, in more complex standard video interfaces such as Camera Serial Interface (CSI) and Embedded Display Port (EDP), video interface clock frequency may not have a ratio of integers relationship to the super-frame pixel clock frequency. Therefore, a fractional clock generation method may be required to support creation of fractional video clocks that cannot be represented as the ratio of two integers in relation to the super-frame pixel clock. A fractional clock generation method has been devised to cover both cases as illustrated in FIG. 3. (DSI, CSI, EDP, LVDS are video interface standards, similar to HDMI: Display serial interface=DSI; Camera serial interface=CSI; Embedded display port=EDP; Low voltage differential signaling=LVDS.)

FIG. 3 depicts a fractional clock divider 300 according to various embodiments of the present disclosure. N is the number of pixels in the super-frame while M is the number of pixels in the split frame.

To cover the basic case where the slow pixel clocks can be represented as the ratio of two large integers a first order one-bit specialized sigma-delta modulator is developed as given in block 303. In traditional sigma-delta modulators the base for delta component is always a multiple of two. In this application, the sigma is equivalent to the number of pixels in the split display's frame (M 301) while the delta is equal to the number of pixels in a super-frame, for example, N 302. As the number of pixels in a super-frame will not be a power of two, the traditional sigma delta modulator's restriction demanding that the delta has is a power of two is not acceptable. The specialized sigma-delta modulator therefore compromises from area consumption and uses a digital adder/subtractor (accumulator 306) instead of a digital comparator to allow sigma-delta modulation to generate a clock as a ratio of two large integers, i.e., M and N. In the open loop operation mode, proportional error is zero and in each super-frame clock cycle 304, accumulator 306 adds M to the accumulation via block 332. If the comparator block 312 sees accumulator output is larger than N 302, the multiplier 314 subtracts N from the accumulation result. Output of 312 is either a 1 or 0 and it is used as the enable for the clock gate 308. Clock gate 308 dynamically gates the 304 and generates the individual display clock 310.

The specialized sigma-delta modulator design can only cover the cases when the video interface is one of the basic interfaces mentioned previously. To extend the solution to cover previously mentioned complex video interfaces and fractional division, a first-in-first-out (FIFO) control loop mode may be added. The FIFO control loop mode may include FIFO counter 316, compare to programmable threshold 318, multiplier 320, and multiplier 322. This control loop is used to dither the sigma value of the modulator and fine tune the frequency of the split displays on the fly to compensate for the division of non-integers relationship between super-frame and the split displays on the steady state by adding the non-zero proportional error from the M.

A digital proportional feedback FIFO control loop is implemented. The input 317 throughput coming from the super-frame is used to increment a FIFO counter 316 and the output 315 throughput going out of to the split displays is used to decrement the counter. As the FIFO counter 316 value increases a certain user defined threshold, the system is identified to have a tendency towards overflow and the error indication to indicate that the split display pixel clock frequency needs to be increased is generated. The absolute value of the error signal is the difference between the programmable threshold 318 and the actual counter value 319. This error signal, generated by multiplier 320, is multiplied by the programmable feedback gain 324, by multiplier 322, and it is added to the sigma value of the specialized sigma delta modulator to create the proportional feedback, i.e. proportional error. As the control loop is designed only to increase frequency, the sigma delta modulator base sigma value needs to be programmed to a slightly lower than expected frequency generation value when this mode is used. In some embodiments, digital feedback control loop may be implemented as a digital feedback control loop. In some embodiments, digital feedback control loop may be implemented by using FIFO fullness level as the correction signal for fine tuning the frequency.

Figure 4:
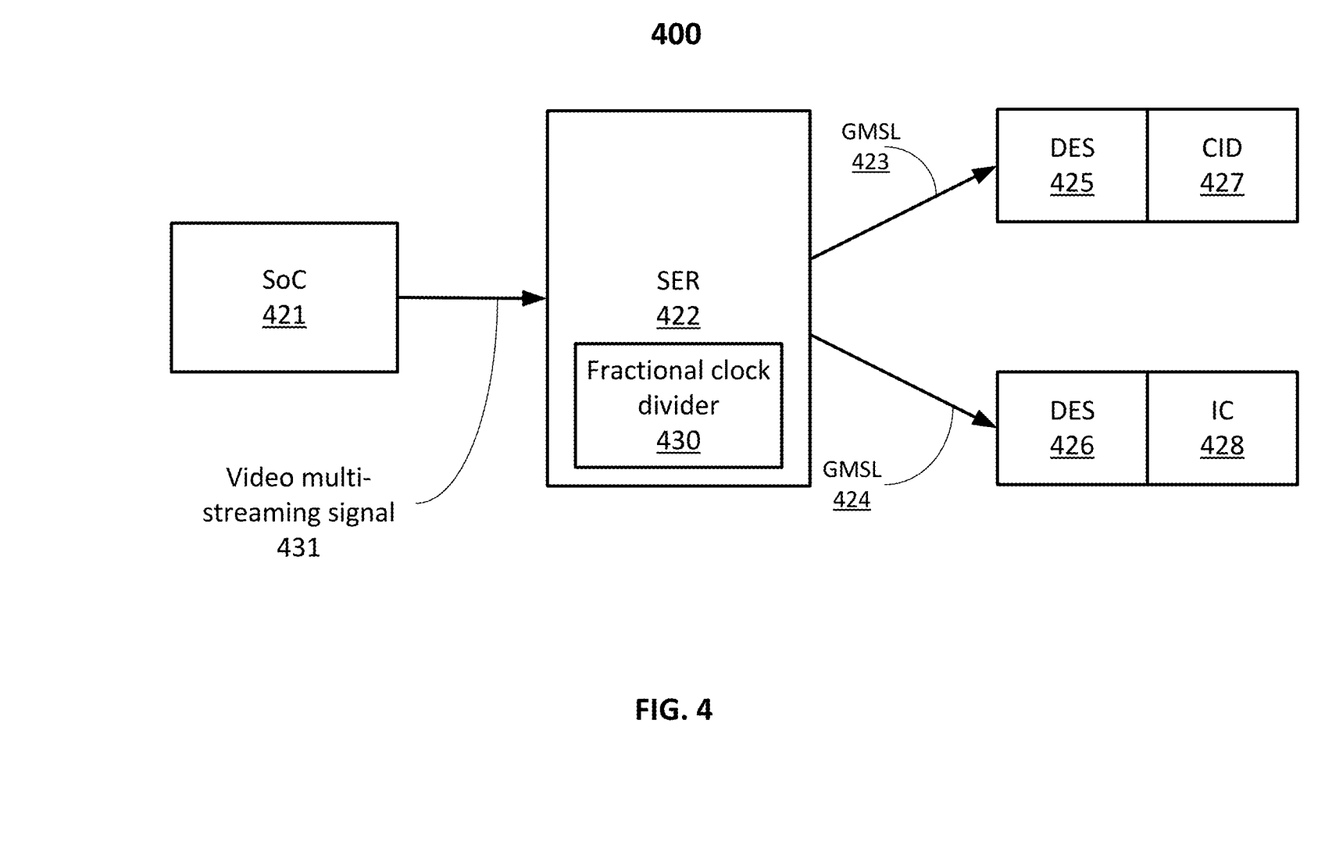
FIG. 4 depicts a configuration for video multi-streaming with a fractional clock divider integrated in a serializer according to embodiments of the present invention.

FIG. 4 depicts a system 400 for video multi-streaming with a memory integrated in a serializer according to embodiments of the present invention. In some embodiments, the memory may implement a look-up-table. As illustrated, SoC 421 outputs a video multi-streaming signal 431 to SER 422. SER 422 comprises a fractional clock divider 430, which may generate individual video display clocks from a single super video stream, which containing multiple display images, without utilizing PLLs. The output of SER 422 may be GMSL 423 and GMSL 424, which are inputs to DES 425 and DES 426, respectively. DES 425 and DES 426 are respectively coupled to CID 427 and IC 428.

In summary, in one or more embodiments, a system supporting image multi-streaming may comprise 1) an asymmetric image splitter engine that splits super-frame image streams into two or more image streams; and 2) a fractional clock divider circuit, further comprising a one-bit sigma delta modulator and a digital proportional error feedback control loop. The fractional clock divider circuit provides compatible display clock frequencies for each of the two or more image streams. The system may be implemented without an incorporation of one or more phase-lock-loop (PLL) oscillators. When a multi-image stream comprises two image streams, the asymmetric image splitter block adjusts a vertical asymmetry of a first image stream with a shortest height to same height as a second image stream by adding horizontal padding to the first image stream.

In one or more embodiments, method for multi-streaming images may comprise 1) receiving a multi-image stream comprising super frame image streams, wherein each super-frame image stream includes a first image stream and a second image stream, and wherein a height of the first image stream is higher than the second image stream; 2) adjusting a vertical asymmetry of the second image stream to same height as the first image stream by adding horizontal padding to the second image stream; 3) utilizing an asymmetric image splitter engine to split the super-frame image streams into two separate image streams; 4) generating compatible display clock frequencies for each of the two separate video display images; and 5) utilizing a fractional clock divider circuit to generate the compatible display clock frequencies.

SYSTEM EMBODIMENTS

In embodiments, aspects of the present patent document may be directed to or implemented on information handling systems/computing systems. For purposes of this disclosure, a computing system may include any instrumentality or aggregate of instrumentalities operable to compute, calculate, determine, classify, process, transmit, receive, retrieve, originate, route, switch, store, display, communicate, manifest, detect, record, reproduce, handle, or utilize any form of information, intelligence, or data for business, scientific, control, or other purposes. For example, a computing system may be elements of a communication system, such as GMSL serializers and deserializers that can simultaneously transport streaming image data. The computing system may include random access memory (RAM), one or more processing resources such as a central processing unit (CPU) or hardware or software control logic, ROM, and/or other types of memory. Additional components of the computing system may include one or more network or wireless ports for communicating with external devices as well as various input and output (I/O) devices, such as a keyboard, a mouse, touchscreen and/or a video display. The computing system may also include one or more buses operable to transmit communications between the various hardware components.

Figure 5:
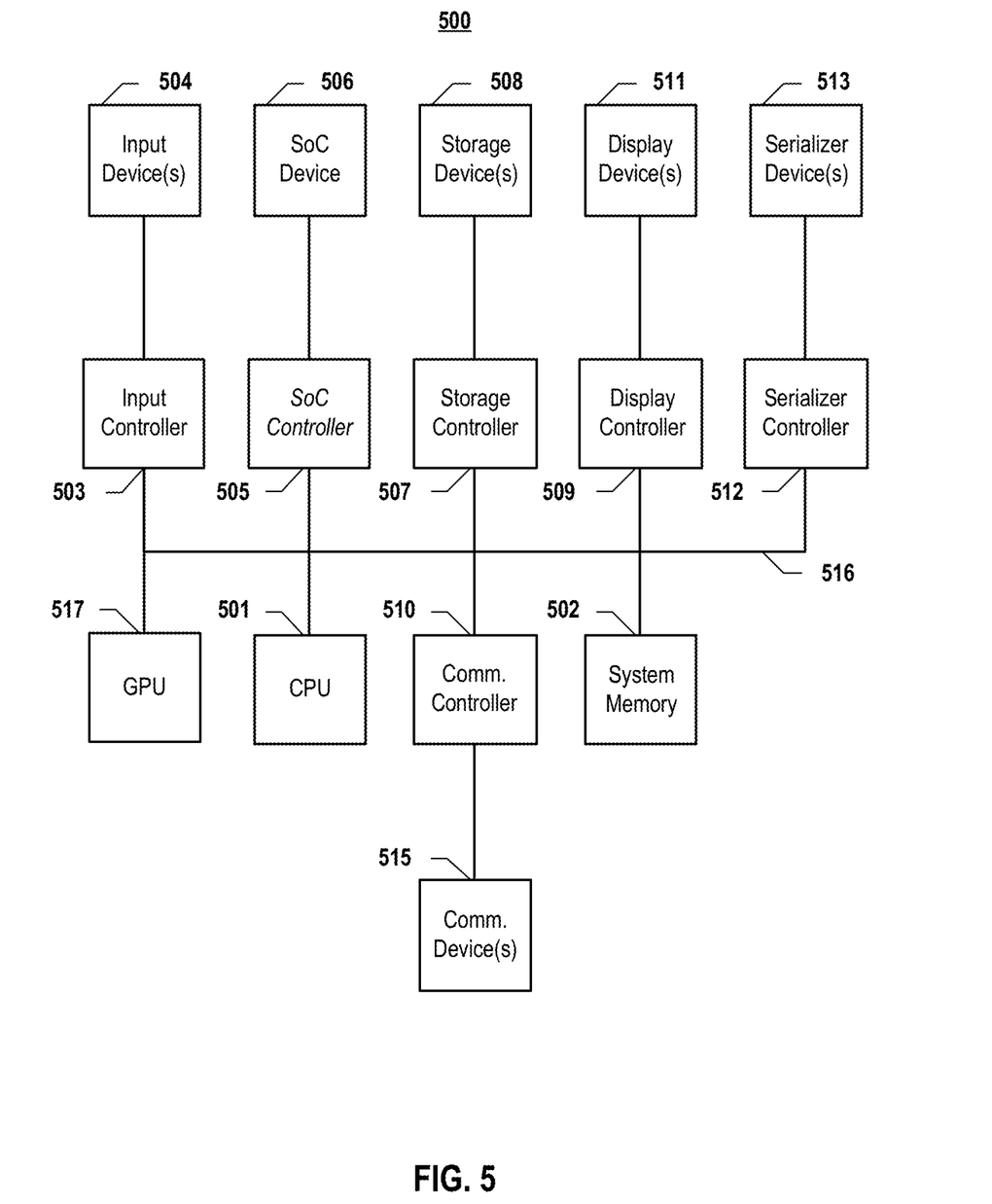
FIG. 5 depicts a simplified block diagram of a computing device/information handling system according to embodiments of the present document.

FIG. 5 depicts a simplified block diagram of a computing device/information handling system (or computing system) according to embodiments of the present disclosure. It will be understood that the functionalities shown for system 500 may operate to support various embodiments of an information handling system—although it shall be understood that an information handling system may be differently configured and include different components.

As illustrated in FIG. 5, system 500 includes one or more central processing units (CPU) 501 that provides computing resources and controls the computer. CPU 501 may be implemented with a microprocessor or the like, and may also include one or more graphics processing units (GPU) 517 and/or a floating point coprocessor for mathematical computations. System 500 may also include a system memory 502, which may be in the form of random-access memory (RAM), read-only memory (ROM), or both.

A number of controllers and peripheral devices may also be provided, as shown in FIG. 5. An input controller 503 represents an interface to various input device(s) 504, such as a keyboard, mouse, or stylus. There may also be a SoC controller 505, which communicates with a SoC device 506. System 500 may also include a storage controller 507 for interfacing with one or more storage devices 508 each of which includes a storage medium such as flash memory, or an optical medium that might be used to record programs of instructions for operating systems, utilities, and applications, which may include embodiments of programs that implement various aspects of the present invention. Storage device(s) 508 may also be used to store processed data or data to be processed in accordance with the invention. System 500 may also include a display controller 509 for providing an interface to a display device 511. The computing system 500 may also include a serializer controller 512 for communicating with a serializer device 513. A communications controller 510 may interface with one or more communication devices 515, which enables system 500 to connect to remote devices through any of a variety of networks including an automotive network, the Internet, a cloud resource (e.g., an Ethernet cloud, an Fiber Channel over Ethernet (FCoE)/Data Center Bridging (DCB) cloud, etc.), a local area network (LAN), a wide area network (WAN), a storage area network (SAN) or through any suitable electromagnetic carrier signals including infrared signals.

In the illustrated system, all major system components may connect to a bus 516, which may represent more than one physical bus. However, various system components may or may not be in physical proximity to one another. For example, input data and/or output data may be remotely transmitted from one physical location to another. In addition, programs that implement various aspects of this invention may be accessed from a remote location (e.g., a server) over a network. Such data and/or programs may be conveyed through any of a variety of machine-readable medium including, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices.

Embodiments of the present invention may be encoded upon one or more non-transitory computer-readable media with instructions for one or more processors or processing units to cause steps to be performed. It shall be noted that the one or more non-transitory computer-readable media shall include volatile and non-volatile memory. It shall be noted that alternative implementations are possible, including a hardware implementation or a software/hardware implementation. Hardware-implemented functions may be realized using ASIC(s), programmable arrays, digital signal processing circuitry, or the like. Accordingly, the "means" terms in any claims are intended to cover both software and hardware implementations. Similarly, the term "computer-readable medium or media" as used herein includes software and/or hardware having a program of instructions embodied thereon, or a combination thereof. With these implementation alternatives in mind, it is to be understood that the figures and accompanying description provide the functional information one skilled in the art would require to write program code (i.e., software) and/or to fabricate circuits (i.e., hardware) to perform the processing required.

It shall be noted that embodiments of the present invention may further relate to computer products with a non-transitory, tangible computer-readable medium that have computer code thereon for performing various computer-implemented operations. The media and computer code may be those specially designed and constructed for the purposes of the present invention, or they may be of the kind known or available to those having skill in the relevant arts. Examples of tangible computer-readable media include, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices. Examples of computer code include machine code, such as produced by a compiler, and files containing higher level code that are executed by a computer using an interpreter. Embodiments of the present invention may be implemented in whole or in part as machine-executable instructions that may be in program modules that are executed by a processing device. Examples of program modules include libraries, programs, routines, objects, components, and data structures. In distributed computing environments, program modules may be physically located in settings that are local, remote, or both.

One skilled in the art will recognize no computing system or programming language is critical to the practice of the present invention. One skilled in the art will also recognize that a number of the elements described above may be physically and/or functionally separated into sub-modules or combined together.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. A system supporting image multi-streaming comprising:
   an asymmetric image splitter engine that splits super-frame image streams into two or more image streams; and
   a fractional clock divider circuit comprising a digital feedback control loop,
   wherein the fractional clock divider circuit provides compatible display clock frequencies for each of the two or more image streams without an incorporation of one or more phase-lock-loop (PLL) oscillators.

2. The system of claim 1, wherein when a multi-streaming image comprises the two or more image streams, the asymmetric image splitter engine adjusts a vertical asymmetry of a first image stream with a shortest height to same height as a second image stream by adding vertical padding to the first image stream.

3. The system of claim 1, wherein the system utilizes a serializer and a deserializer (SerDes).

4. The system of claim 1, wherein the fractional clock divider circuit further comprises a one-bit sigma delta modulator.

5. The system of claim 4, wherein the one-bit sigma delta modulator comprises a digital adder/subtractor and a comparator block.

6. The system of claim 1, wherein the digital feedback control loop comprises a first-in-first out (FIFO) counter and a programmable threshold.

7. The system of claim 6, wherein a difference between a value of the FIFO counter and a value of the programmable threshold is an error signal, wherein when the error signal is multiplied by a programmable feedback gain, a proportional feedback is generated to adjust a number of pixels in a split display's frame.

8. The system of claim 1, wherein the super-frame image streams comprise video images.

9. The system of claim 1, wherein the super-frame image streams comprise image streams supporting Advanced Driver-Assistance Systems (ADAS) or automotive infotainment applications.

10. The system of claim 1, wherein the super-frame image streams comprise image streams from Light Detection and Ranging (LIDAR) devices, radar, or other sensors.

11. A method comprising:
receiving a multi-image stream comprising super frame image streams, wherein each super-frame image stream includes a first image stream and a second image stream and wherein a height of the first image stream is higher than the second image stream;
adjusting a vertical asymmetry of the second image stream to same height as the first image stream by adding vertical padding to the second image stream;
utilizing an asymmetric image splitter engine to split the super-frame image streams into two separate image streams;
generating compatible display clock frequencies for each of the two separate image streams without an incorporation of one or more phase-lock-loop (PLL) oscillators; and
utilizing a fractional clock divider circuit to generate the compatible display clock frequencies.

12. The method of claim 11, wherein the fractional clock divider circuit comprises a digital feedback control loop and a one-bit sigma delta modulator.

13. The method of claim 12, wherein the one-bit sigma delta modulator comprises a digital adder/subtractor and a comparator block, wherein individual display clocks are generated based on an output of the comparator block.

14. The method of claim 12, wherein the digital feedback control loop comprises an up-down first-in-first-out (FIFO) counter, a programmable threshold and a programmable feedback gain that collectively provide a proportional feedback to adjust a number of pixels in a split display's frame.

15. The method of claim 11, wherein the super-frame image streams comprise video images.

16. A non-transitory computer readable storage medium having computer program code stored thereon, the computer program code, when executed by one or more processors implemented on a communication device, causes the communication device to perform a method comprising:
receiving a multi-image stream comprising super frame image streams, wherein each super-frame image stream includes a first image stream and a second image stream and wherein a height of the first image stream is higher than the second image stream;
adjusting a vertical asymmetry of the second image stream to same height as the first image stream by adding vertical padding to the second image stream;
utilizing an asymmetric image splitter engine to split the super-frame image streams into two separate image streams; and
utilizing a fractional clock divider circuit to generate compatible display clock frequencies for each of the two separate image streams without an incorporation of one or more phase-lock-loop (PLL) oscillators.

17. The non-transitory computer readable storage medium of claim 16, wherein the super-frame image streams comprise image streams from video, Light Detection and Ranging (LIDAR) devices, radar, or other sensors.

18. The non-transitory computer readable storage medium of claim 16, wherein the fractional clock divider circuit comprises a digital feedback control loop and a one-bit sigma delta modulator.

* * * * *